(12) United States Patent
Saito et al.

(10) Patent No.: US 10,292,281 B2
(45) Date of Patent: May 14, 2019

(54) ELECTRONIC CONTROL DEVICE

(71) Applicant: Hitachi Automotive Systems, Ltd., Hitachinaka-shi, Ibaraki (JP)

(72) Inventors: Masato Saito, Hitachinaka (JP); Yoshio Kawai, Hitachinaka (JP); Shoho Ishikawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 4 days.

(21) Appl. No.: 15/538,387

(22) PCT Filed: Jan. 8, 2016

(86) PCT No.: PCT/JP2016/050422
§ 371 (c)(1),
(2) Date: Jun. 21, 2017

(87) PCT Pub. No.: WO2016/114222
PCT Pub. Date: Jul. 21, 2016

(65) Prior Publication Data
US 2018/0020558 A1 Jan. 18, 2018

(30) Foreign Application Priority Data
Jan. 14, 2015 (JP) ................. 2015-004970

(51) Int. Cl.
*H02G 3/16* (2006.01)
*H05K 5/00* (2006.01)
(Continued)

(52) U.S. Cl.
CPC .......... *H05K 5/0082* (2013.01); *B60R 16/02* (2013.01); *B60R 16/0215* (2013.01);
(Continued)

(58) Field of Classification Search
CPC ................ H05K 5/0082; H05K 5/0069; B60R 16/0215; H01R 12/716; H01R 13/50; H01R 13/533; H01R 2201/26
(Continued)

(56) References Cited

U.S. PATENT DOCUMENTS

2005/0028624 A1  2/2005  Murakami et al.
2009/0117758 A1  5/2009  Yamaguchi
(Continued)

FOREIGN PATENT DOCUMENTS

DE   297 21 908 U1   2/1998
DE   199 01 913 A1   7/2000
(Continued)

OTHER PUBLICATIONS

International Search Report (PCT/ISA/210) issued in PCT Application No. PCT/JP2016/050422 dated Apr. 26, 2016 with English translation (Four (4) pages).
(Continued)

Primary Examiner — Michael P McFadden
(74) Attorney, Agent, or Firm — Crowell & Moring LLP

(57) ABSTRACT

Provided is an electronic control device that is easily assembled and with which it is possible to reduce the effects of vibration and external force applied from a connector. Electronic components are installed on a substrate. A base covers a surface of the substrate. A cover covers a surface of the substrate. A first connector, which is installed on the surface, connects to a connector fixed to an on-board transmission. A second connector, which is installed on the surface, connects to a connector of a harness. First vibration-suppressing parts, which are provided to the inside surface of the base facing the end surface of the first connector on the surface side, suppress the vibration of the first connector.

12 Claims, 7 Drawing Sheets

(51) Int. Cl.
  *B60R 16/02* (2006.01)
  *F16H 61/00* (2006.01)
  *H01R 12/71* (2011.01)
  *H01R 13/50* (2006.01)
  *H01R 13/73* (2006.01)
  *H01R 13/533* (2006.01)

(52) U.S. Cl.
  CPC .......... *F16H 61/00* (2013.01); *H01R 12/71* (2013.01); *H01R 12/716* (2013.01); *H01R 13/50* (2013.01); *H01R 13/533* (2013.01); *H01R 13/73* (2013.01); *H02G 3/16* (2013.01); *H05K 5/0056* (2013.01); *H05K 5/0069* (2013.01); *H01R 2201/26* (2013.01)

(58) Field of Classification Search
  USPC ........................................................ 361/748
  See application file for complete search history.

(56) References Cited

U.S. PATENT DOCUMENTS

| | | | |
|---|---|---|---|
| 2012/0127677 A1 | 5/2012 | Wakana et al. | |
| 2013/0114224 A1* | 5/2013 | Liskow | H05K 5/0082 361/767 |
| 2014/0233188 A1* | 8/2014 | Terasawa | H05K 7/1432 361/719 |
| 2015/0244097 A1* | 8/2015 | Hirayama | H01R 13/405 439/660 |

FOREIGN PATENT DOCUMENTS

| | | |
|---|---|---|
| JP | 4-133362 U | 12/1992 |
| JP | 5-41080 U | 6/1993 |
| JP | 9-331180 A | 12/1997 |
| JP | 9-331181 A | 12/1997 |
| JP | 2002-190345 A | 7/2002 |
| JP | 2005-151670 A | 6/2005 |
| JP | 2009-74699 A | 4/2009 |
| JP | 2009-118656 A | 5/2009 |
| JP | 2011-199941 A | 10/2011 |
| JP | 2012-109161 A | 6/2012 |
| JP | 2012-129017 A | 7/2012 |

OTHER PUBLICATIONS

Japanese-language Written Opinion (PCT/ISA/237) issued in PCT Application No. PCT/JP2016/050422 dated Apr. 26, 2016 (Five (5) pages).

Japanese-language Office Action issued in counterpart Japanese Application No. 2016-569339 dated Jul. 3, 2018 with English translation (eight (8) pages).

Extended European Search Report issued in counterpart European Application No. 16737293.7 dated Aug. 28, 2018 (eight (8) pages).

* cited by examiner

ENLARGED VIEW OF PART A

B-B

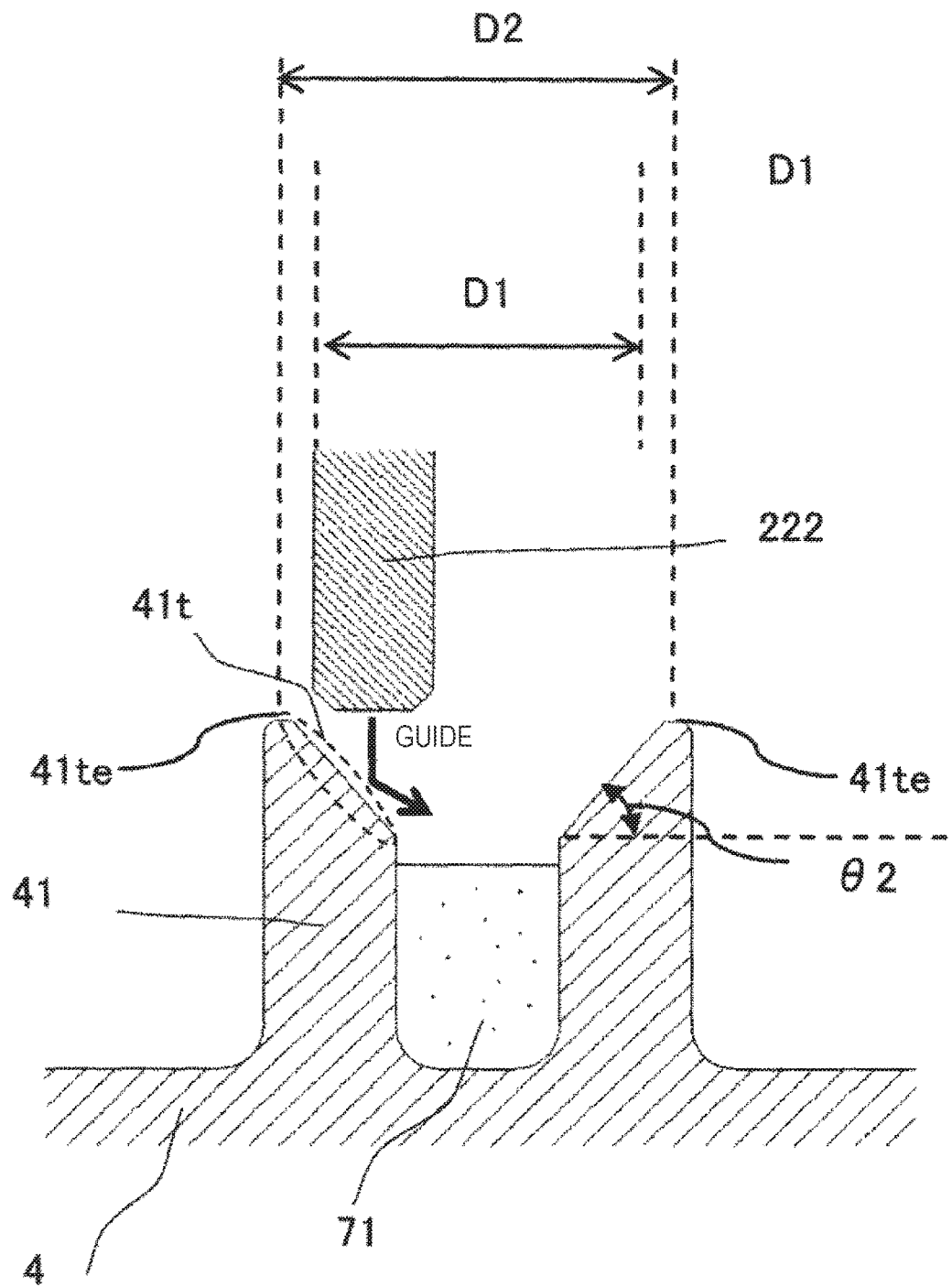

ELECTRONIC CONTROL DEVICE

TECHNICAL FIELD

The present invention relates to an electronic control device.

BACKGROUND ART

A recent trend in automobiles is toward a more compact and narrower space provided in an engine compartment in order to respond to a need to allow for a greater interior space available and an increased number of parts disposed in the engine compartment. Another trend, which grows year after year, is toward reduced cost of vehicles. A need thus exists in a method for mounting an electronic control device for a structure that enables mounting requiring reduced cost and reduced space.

A known electronic control device, for example, for controlling an on-board transmission is mounted on the side of a vehicle body frame inside an engine compartment and connected with the on-board transmission or another on-board control device via a harness. Against this background, a new need nowadays exists for a structure that is intended to reduce cost, weight, and mounting space by directly mounting the electronic control device on the on-board transmission to thereby eliminate the need for the harness between the on-board transmission and the electronic control device.

Such a structure integrating the electronic control device with the on-board transmission is, however, more susceptible to the effects of vibration and heat transmitted directly from the on-board transmission than the known structure mounted on the side of the vehicle body frame. Hence, a more stringent mounting environment for the electronic control device.

The traditional structure connecting the on-board transmission with the electronic control device via the harness, in particular, contributed to reduced effects of vibration from the on-board transmission. In contrast, the later model of electronic control device is subject to greater effects of vibration from the on-board transmission because of the electronic control device being fitted into the connector on the side of the on-board transmission.

Additionally, the electronic control device includes, in addition to the connector connecting with the on-board transmission, another connector that is to be connected via a harness with another on-board control device disposed in the engine compartment. Such a connector is subject to even greater effects of vibration because the harness concerned is oscillated by greater vibration than with the structure in which the electronic control device is mounted on the side of the vehicle body frame.

It is here noted that one known electronic control device connected directly with an on-board transmission and including a vehicle system connection connector incorporates a structure in which each connector is screwed to a metal base (see, for example, PTL 1).

In another known structure, a connector fixing screw has a leading end fixed to a metal base using a heat conductive adhesive (see, for example, PTL 2).

CITATION LIST

Patent Literature

PTL 1: JP 2009-74699 A
PTL 2: JP 2012-129017 A

SUMMARY OF INVENTION

Technical Problem

In the structure disclosed in PTL 1, a connector is fixed to a metal base using a screw, an area around the connector is sealed, and then a substrate is connected with a connector pin. The foregoing procedure results in a complicated assembly method of the electronic control device, involving increased cost.

In the structure disclosed in PTL 2, a metal collar nut is inserted molded with a connector and then the connector is fixed to a substrate using a screw before a leading end of the screw is bonded and fixed to a metal housing. The foregoing procedure requires the use of the metal collar nut, leading to increased cost. Additionally, the procedure results in the leading end of the screw that protrudes to the side of the surface on which the connector is disposed being bonded and fixed to the housing. Thus, any external pressing force exerted from the connector applies force to the adhesive in a direction in which the adhesive is peeled off. Thus, a reduced holding power of the adhesive results. It is noted that the structure disclosed in PTL 2 does not include any connector directly connected with the on-board transmission.

An object of the invention is to provide an electronic control device capable of easy assembly and of reducing the effects of vibration and external force applied from a connector.

Solution to Problem

In order to solve the above issue, the present invention includes: a substrate on which electronic components are disposed; a base that covers a first surface of the substrate; a cover that covers a second surface of the substrate; a first connector disposed on the second surface of the substrate, the first connector connecting to a connector fixed to an on-board transmission; a second connector disposed on the second surface of the substrate, the second connector connecting to a connector of a harness; and a first vibration-suppressing part disposed on an inside surface of the base, the inside surface of the base facing an end face of the first connector on a side adjacent to the second surface, the first vibration-suppressing part suppressing vibration of the first connector.

Advantageous Effects of Invention

According to the invention, an assembly process is facilitated and the effects of vibration and external force applied from a connector can be reduced. Problems, configurations, and effects other than those described above will be clarified by the following description of embodiments.

BRIEF DESCRIPTION OF DRAWINGS

FIG. 10 is a cross-sectional view illustrating a recess in abase incorporated in an electronic control device according to a second modification of the present invention.

DESCRIPTION OF EMBODIMENTS

Figure 1:
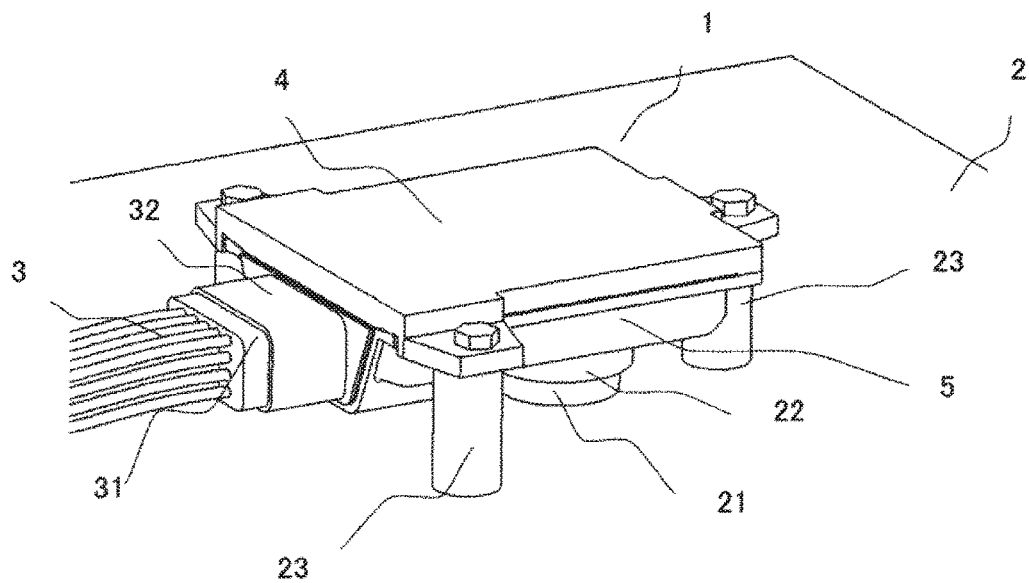
FIG. 1 is a perspective view illustrating an electronic control device according to a first embodiment of the present invention.

Configurations and effects of a vehicle electronic control device according to first to sixth embodiments of the present invention will hereinafter be described with reference to the accompanying drawings. It is noted that like reference numerals denote like parts in each of the accompanying drawings.

First Embodiment

Figure 2:
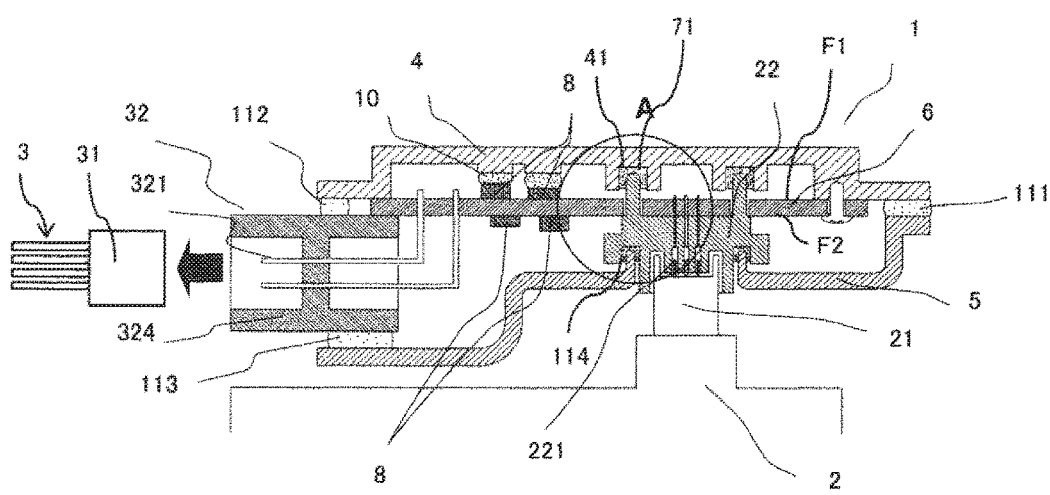
FIG. 2 is a cross-sectional view illustrating the electronic control device illustrated in FIG. 1.
Figure 3:
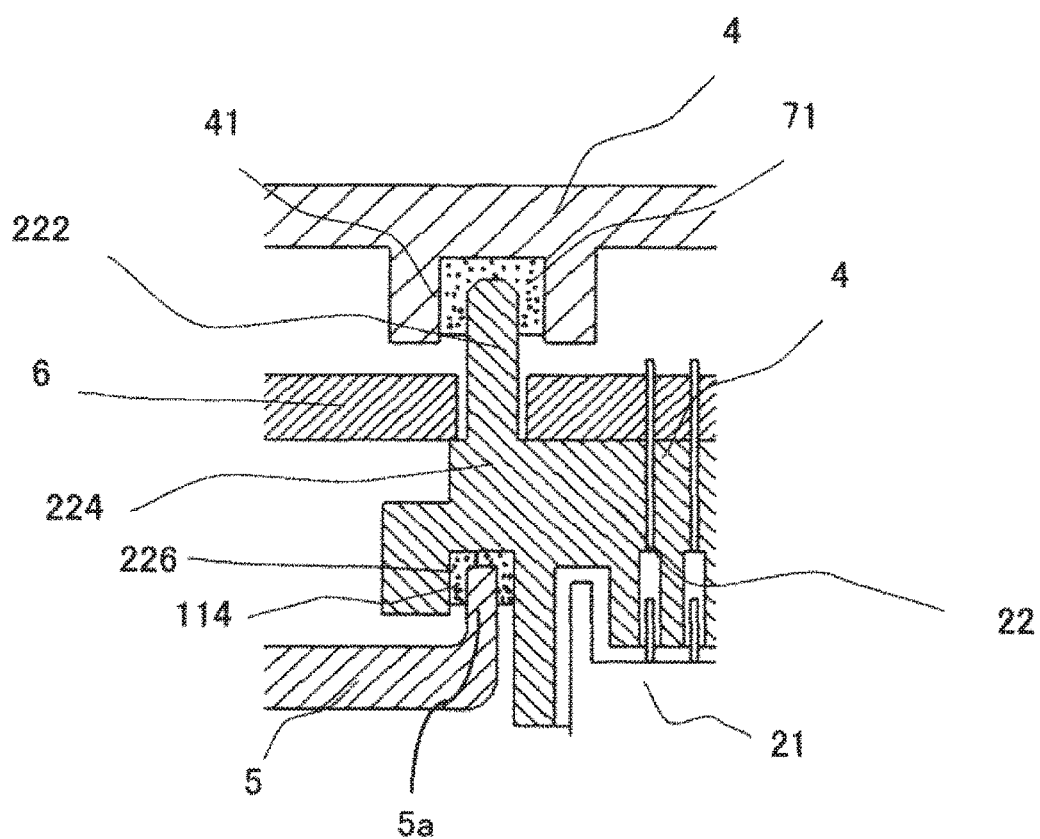
FIG. 3 is an enlarged cross-sectional view illustrating a main part (part A) of the electronic control device illustrated in FIG. 2.

A configuration of an electronic control device 1 will be described below with reference to FIGS. 1 to 3. FIG. 1 is a perspective view illustrating the electronic control device 1 according to a first embodiment of the present invention. FIG. 2 is a cross-sectional view illustrating the electronic control device 1 illustrated in FIG. 1. FIG. 3 is an enlarged cross-sectional view illustrating a main part (part A) of the electronic control device 1 illustrated in FIG. 2.

An automatic transmission control unit (ATCU) as an electronic control device mounted in an engine compartment, in particular, will be described for the present embodiment.

Reference is made to FIG. 2. The electronic control device 1 includes a substrate 6, a base 4, a cover 5, a vibration-damping member 71, a heat dissipating material 10, and sealing members 111 to 114. More specifically, a first connector 22 to be connected with an on-board transmission 2, a second connector 32 to be connected with a connector 31 of a vehicle harness 3, and a plurality of electronic components 8 are mounted on the substrate 6. The base 4 and the cover 5 house thereinside the substrate 6 on which the first connector 22, the second connector 32, and the electronic components 8 are mounted.

Examples of materials for the vibration-damping member 71 include, but are not limited to, silicone-based, epoxy-based, and urethane-based adhesives, greases, gels, and potting agents. It is noted that the vibration-damping member 71 may be formed of a material that forms the sealing members 111 to 114. Additionally, the sealing members 111 to 114 may be formed of a material that forms the heat dissipating material 10.

As illustrated in FIG. 2, the first connector 22 is a female connector having a connector face extending in a direction perpendicular to the substrate 6. The first connector 22 is fitted with a male connector 21 that protrudes from a surface of the on-board transmission 2. It is noted that the first connector 22 has an axis extending perpendicularly to the substrate 6.

The second connector 32 is a male connector having a face extending horizontally with respect to the substrate 6. The second connector 32 is fitted with the female connector 31 of the harness 3 that is wired to another on-board control device. It is noted that the second connector 32 has an axis extending horizontally with respect to the substrate 6.

The first connector 22 and the second connector 32 are formed of a resin such as polybutylene terephthalate (PBT), polyphenylene sulfide (PPS), and nylon (PA). The first connector 22 and the second connector 32 include a plurality of connector pins 221 and 321, respectively, for giving and receiving voltage and current to and from an outside.

Reference is made to FIG. 3. The first connector 22 has a groove 226 (sealing groove) formed in an outer periphery thereof. The sealing member 114 for waterproofing is filled in the groove 226. Specifically, the first connector 22 has, in an outer peripheral surface thereof, the groove 226 that faces the case 5 and includes the sealing member 114 (vibration-damping member) filled in the groove 226. The case 5 has a protrusion 5a that fits into the groove 226 in the first connector 22. The protrusion 5a is disposed so as to face a recess 41 in the base 4 around this hole.

The protrusion 5a of the cover 5 fits into the groove 226 to thereby waterproof the first connector 22 from therearound. It is here noted that the sealing groove 226 is disposed so as to face, across the substrate 6, a recess 41 in the base 4 in which the vibration-damping member 71 is filled.

The foregoing configuration enables an external force applied to the first connector 22 to obtain a stress relief effect in both depressing and extracting directions.

As illustrated in FIG. 2, the cover 5 has an opening through which the first connector face is exposed to the outside. Specifically, the case 5 has a hole through which the first connector 22 passes. The cover 5 is formed of a resin, such as polybutylene terephthalate (PBT), polyphenylene sulfide (PPS), and nylon (PA), or a metal having aluminum or iron as a main component. The cover 5 covers a first surface F1 of the substrate 6.

Additionally, the waterproof sealing members 111 and 112 are applied to an outer periphery of the base 4 and bonded with the cover 5 and the second connector 32. Additionally, the waterproof sealing member 113 is applied to the side of the second connector 32 adjacent to the cover 5 and bonded with the cover 5. The foregoing arrangement prevents entry of water into the inside of the electronic control device 1. It is noted that the base 4 covers a second surface F2 of the substrate 6.

The heat dissipating material 10 for dissipating heat is applied to a component that generates heat, in particular, out of the electronic components 8 mounted on the substrate 6. This arrangement allows heat generated by the electronic component 8 to be dissipated to the base 4.

The base 4 is intended to dissipate heat generated by the heat generating component on the substrate 6 and to fix the electronic control device 1 to the on-board transmission 2. It is noted that, as illustrated in FIG. 1, the base 4 is fixed to the on-board transmission 2 by a mounting boss 23 and a bolt. The base 4 is formed of a metal having aluminum or iron as a main component. The base 4 is molded by aluminum diecasting or sheetmetal working.

The cover 5 is fixed to the base 4 by a screw or caulking (not illustrated). The substrate 6 has a multi-layer structure in which a substrate of a glass cloth impregnated with an epoxy resin is used as a main material and a copper trace layer is stacked on the substrate. The electronic components 8 are connected with the two surfaces of the substrate 6 by soldering (not illustrated) and the trace layer forms an electric circuit.

The first connector 22 and the second connector 32 are fixed to the substrate 6 by a snap fit or using screws before the connector pins 221 are connected by flow soldering (not illustrated).

In the present embodiment, the first connector 22 and the second connector 32 are mounted on the same surface side of the substrate 6. Specifically, the first connector 22 that is directly connected with (inserted into) the connector 21 fixed to the on-board transmission 2 is mounted on the surface F2 of the substrate 6 and the second connector 32 that is connected with the connector 31 of the harness 3 is also mounted on the surface F2 of the substrate 6.

Thus, the connector pins 22 and 32 can be simultaneously subject to flow soldering, so that the process can be simplified. Additionally, the first connector and the second connector can be easily assembled.

Because the two connectors are mounted on the same substrate, however, the first connector 22 directly subjected to vibration of the on-board transmission 2 and the second connector 32 subjected to vibration of the harness 3 may yield a combined effect of excessively deforming the substrate 6, thus resulting in considerable reduction in reliability of the electronic components 8 and the substrate connectors.

In addition, because of the structure involved in the first connector 22 being directly fixed to the substrate 6, force occurring during fitting of the first connector 22 to the connector 21 on the on-board transmission 2 side is directly applied to the substrate 6.

The present embodiment is intended, in the electronic control device 1 directly mounted on the on-board transmission 2, to reduce vibration from the on-board transmission 2 and stress effects during fitting, to thereby enhance reliability of the electronic components 8, the substrate 6, and the connectors.

As illustrated in FIG. 3, in accordance with the structure of the present embodiment, the first connector 22 includes a plurality of resin pins 222 disposed on the side thereof adjacent to the substrate 6. Specifically, the first connector 22 includes the resin pins 222 (columnar portions) disposed on an end face thereof adjacent to the surface F2 of the substrate 6. The resin pins are integrally molded with the first connector 22.

The substrate 6 has holes through which the resin pins 222 are passed. The resin pins extend up to the base 4. The base 4 has the recesses 41 formed at positions inside the base 4. The recesses 41 at these positions face the respective resin pins 222. The vibration-damping member 71 is filled in each of the recesses 41. The resin pins 222 are inserted in and bonded with the respective recesses 41.

It is here noted that the recess 41 into which the leading end of the corresponding resin pin 222 (columnar portion) is inserted and the vibration-damping member 71 filled in the recess 41 constitute a first vibration-suppressing part. Each first vibration-suppressing part is disposed on the inside surface of the base 4, facing the end face of the first connector 22 on the side adjacent to the surface F2 of the substrate 6. The first vibration-suppressing part suppresses vibration of the first connector 22.

The foregoing arrangements enable the vibration-damping members 71 bonded and fixed with the respective resin pins 222 to absorb vibrational effects applied from the on-board transmission 2.

The vibration-damping member 71 can also receive and reduce the fitting force produced when the first connector 22 is fitted to the connector 21 on the on-board transmission 2 side.

The concave shape formed as a vibration-damping member filling portion in the base 4 allows lateral surfaces of the resin pin 222 to be bonded with the vibration-damping member 71. Thus, a wide bonding area can be achieved in a small space.

As described above, the present embodiment can facilitate the assembly process and reduce the effects of vibration and external force applied from the connector.

Second Embodiment

Figure 4:
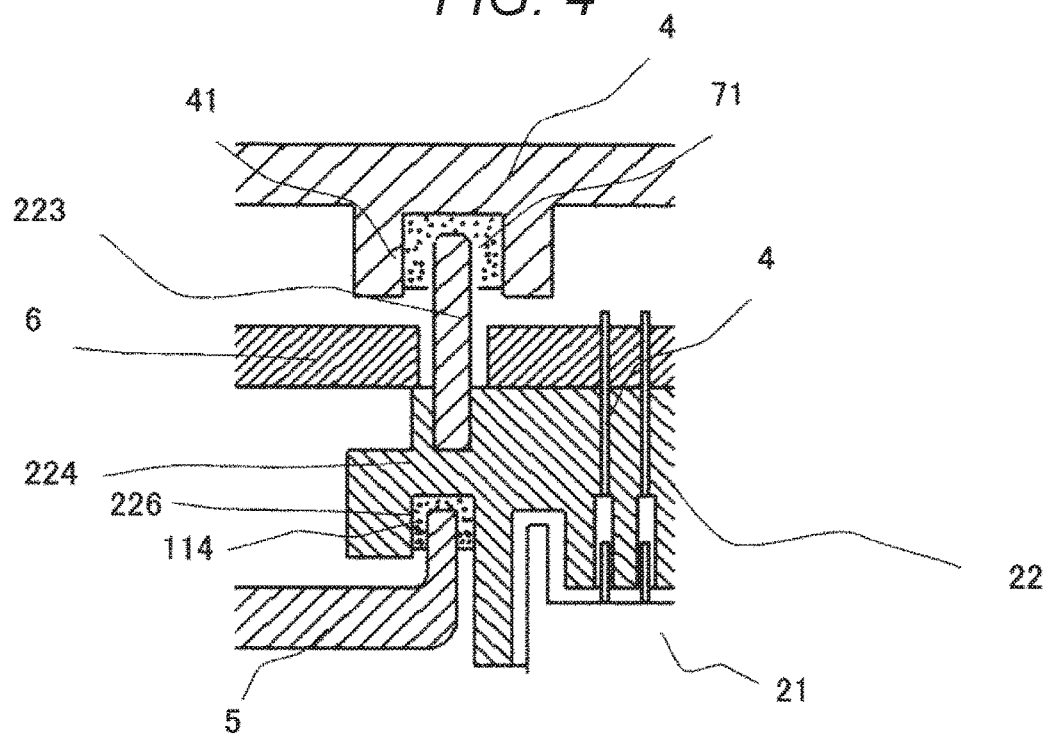
FIG. 4 is an enlarged cross-sectional view illustrating a main part of an electronic control device according to a second embodiment of the present invention.

FIG. 4 is an enlarged cross-sectional view illustrating a main part (part A) of an electronic control device 1 according to a second embodiment of the present invention.

In the present embodiment, a first connector 22 includes, instead of the resin pin 222 illustrated in FIG. 3, a metal pin 223 (metal pin (columnar portion)). The metal pin 223 is inserted into a recess 41 in which a vibration-damping member 71 is filled.

Because the connection with the side of a base 4 is achieved by the metal pin 223 in the present structure, more rigid fixing can be made than the resin pin 222 illustrated in FIG. 3 can. Additionally, the identical effect can be achieved even with a narrower pin diameter than with the resin pin 222. Thus, reduction in the mounting area can also be achieved.

As described above, the present embodiment can facilitate the assembly process and reduce the effects of vibration and external force applied from the connector.

Third Embodiment

Figure 5:
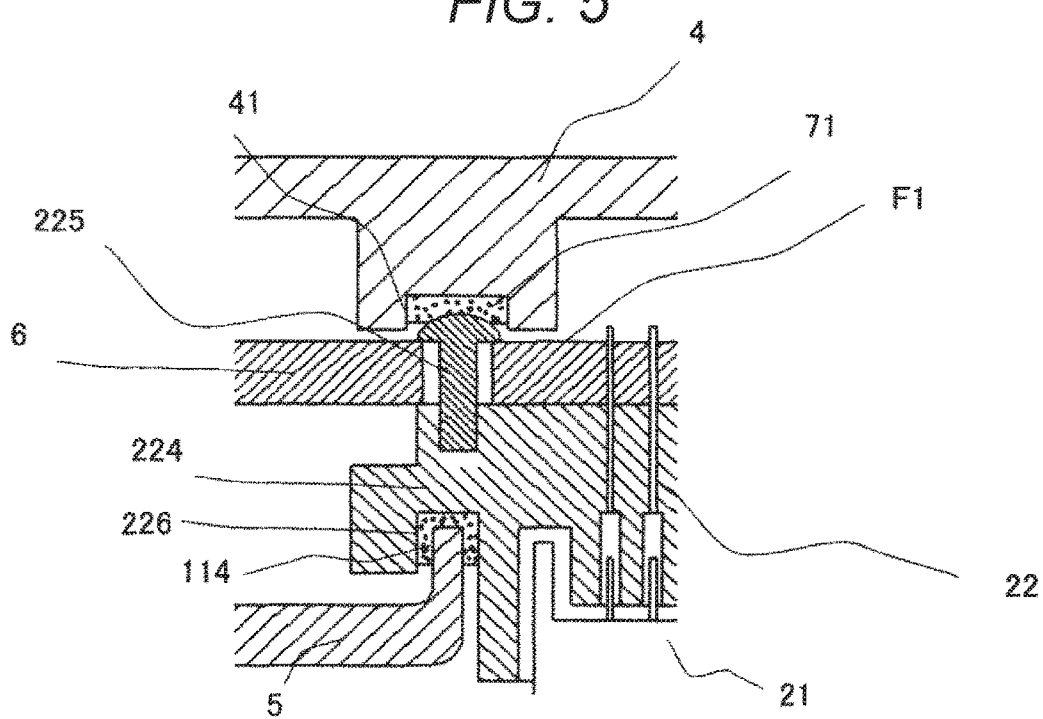
FIG. 5 is an enlarged cross-sectional view illustrating a main part of an electronic control device according to a third embodiment of the present invention.

FIG. 5 is an enlarged cross-sectional view illustrating a main part (part A) of an electronic control device 1 according to a third embodiment of the present invention.

In the present embodiment, a first connector 22 includes, instead of the resin pin 222 illustrated in FIG. 3, a screw 225 (columnar portion). The first connector 22 is fixed to a substrate 6 by the screw 225.

The screw 225 has a head portion protruding from a back surface of the substrate 6. The screw 225 has the head portion bonded with a vibration-damping member 71 filled in a recess 41 in a base 4. This arrangement allows the identical effect to be achieved.

The structure of the present embodiment enables fixing at a position even closer to the substrate 6, thus achieving a greater vibration damping effect. It is noted that the head portion of the screw 225 is disposed on a surface F1 of the substrate 6.

Additionally, the screw 225 incorporated in the structure is a tapping screw that is directly screwed onto a first connector housing 224 formed of a resin. This arrangement eliminates the need for a collar nut or a similar part in the first connector housing 224, so that the structure can be achieved at low cost.

As described above, the present embodiment can facilitate the assembly process and reduce the effects of vibration and external force applied from the connector.

Fourth Embodiment

Figure 6:
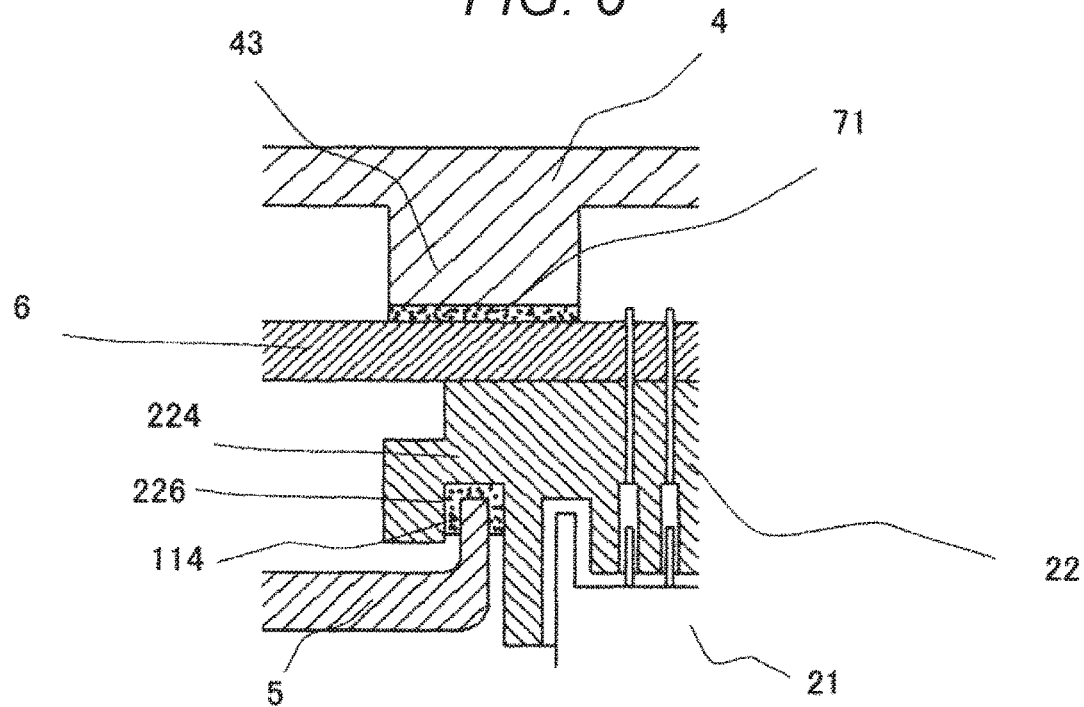
FIG. 6 is an enlarged cross-sectional view illustrating a main part of an electronic control device according to a fourth embodiment of the present invention.

FIG. 6 is an enlarged cross-sectional view illustrating a main part (part A) of an electronic control device 1 according to a fourth embodiment of the present invention.

In the present embodiment, a base 4 includes a boss 43 disposed at a position at which the boss 43 faces aback surface of a first connector 22 (a surface of the first connector 22 facing a substrate 6). The boss 43 is fixed to the substrate 6 by a vibration-damping member 71.

It is here noted that the boss 43 provided on the inside surface of the base 4 and the vibration-damping member 71 disposed at the leading end of the boss 43 constitute a first vibration-suppressing part.

This structure, although being required to offer a wider bonding area unlike the first embodiment, achieves a bonding area without the need to allow for the position of the resin pin or screw. Bonding can thus be made by using a dead space of the substrate 6 on which no electronic components 8 are mounted (e.g., component mounting-prohibited area around the connector pins as affected by flow soldering).

As described above, the present embodiment can facilitate the assembly process and reduce the effects of vibration and external force applied from the connector.

Fifth Embodiment

Figure 7:
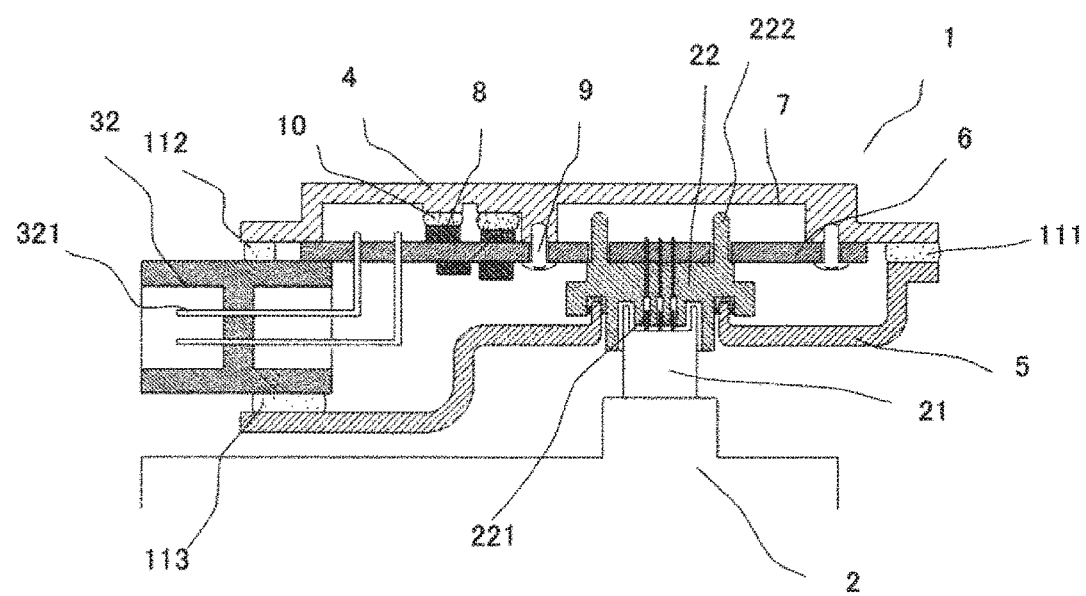
FIG. 7 is a cross-sectional view illustrating an electronic control device according to a fifth embodiment of the present invention.

FIG. 7 is a cross-sectional view illustrating an electronic control device 1 according to a fifth embodiment of the present invention.

In the present embodiment, part of a substrate 6 on the side of a second connector 32 relative to a first connector 22 is fixed to a base 4 by a fastening member 9. The substrate 6 has a hole formed between a position thereof at which the first connector 22 is mounted and a position thereof at which the second connector 32 is mounted. The fastening member 9 is passed through this hole.

It is noted that the fastening member 9 is a screw, a snap fit, or the like (coupling member). A vibration-damping member 7 is filled between the base 4 which leading ends of resin pins 222 face and the substrate 6.

The foregoing arrangements allow both vibration from the first connector 22 and vibration from the second connector 32 to be suppressed.

As described above, the present embodiment can facilitate the assembly process and reduce the effects of vibration and external force applied from the connector.

Sixth Embodiment

Figure 8:
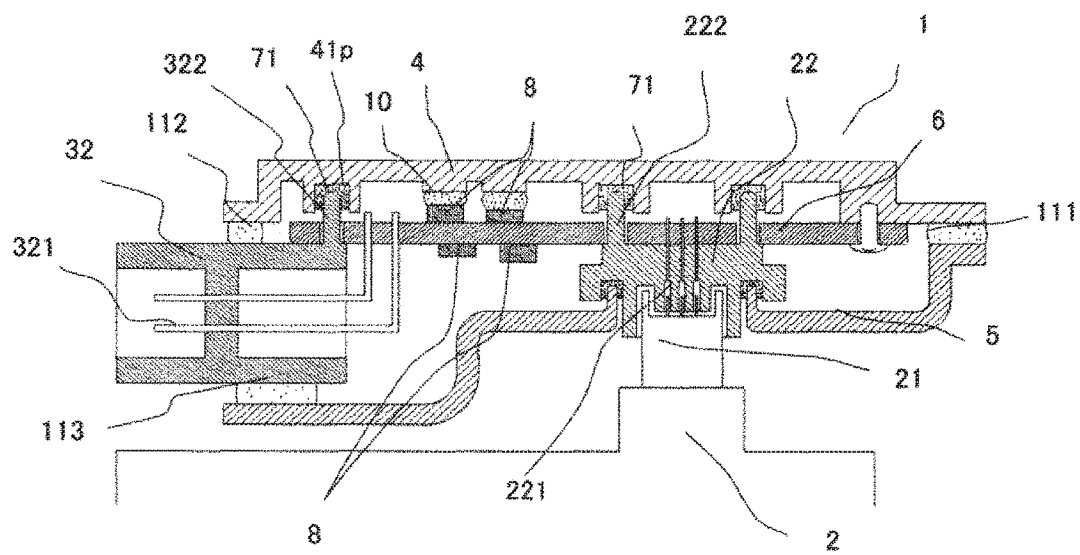
FIG. 8 is a cross-sectional view illustrating an electronic control device according to a sixth embodiment of the present invention.

FIG. 8 is a cross-sectional view illustrating an electronic control device 1 according to a sixth embodiment of the present invention.

The structure in the present embodiment connects a base and connectors using vibration-damping members applied to an area near a second connector 32 as well as an area near a first connector 22.

Specifically, the second connector 32 that faces a substrate 6 includes a resin pin 322 formed on an outside surface thereof. The resin pin 322 extends perpendicularly from the outside surface of the second connector 32. A base 4 has a recess 41p formed at a position on the inside thereof facing the resin pin 322. A vibration-damping member 71 is filled in the recess 41p, so that the resin pin 322 is inserted in and bonded with the recess 41p.

It is noted that the recess 41p into which the leading end of the resin pin 322 (columnar portion) is inserted and the vibration-damping member 71 filled in the recess 41p constitute a second vibration-suppressing part. The second vibration-suppressing part is disposed on an inside surface of the base 4 that faces an outside surface of the second connector 32 on the side of a surface F2 of the substrate 6. The second vibration-suppressing part suppresses vibration of the second connector 32.

The foregoing structure can considerably reduce oscillation of the second connector 32 that is oscillated by vibration of a harness 3, so that the vibration suppression effect can be even greater.

As described above, the present embodiment can facilitate the assembly process and reduce the effects of vibration and external force applied from the connector.

First Modification

Figure 9A:
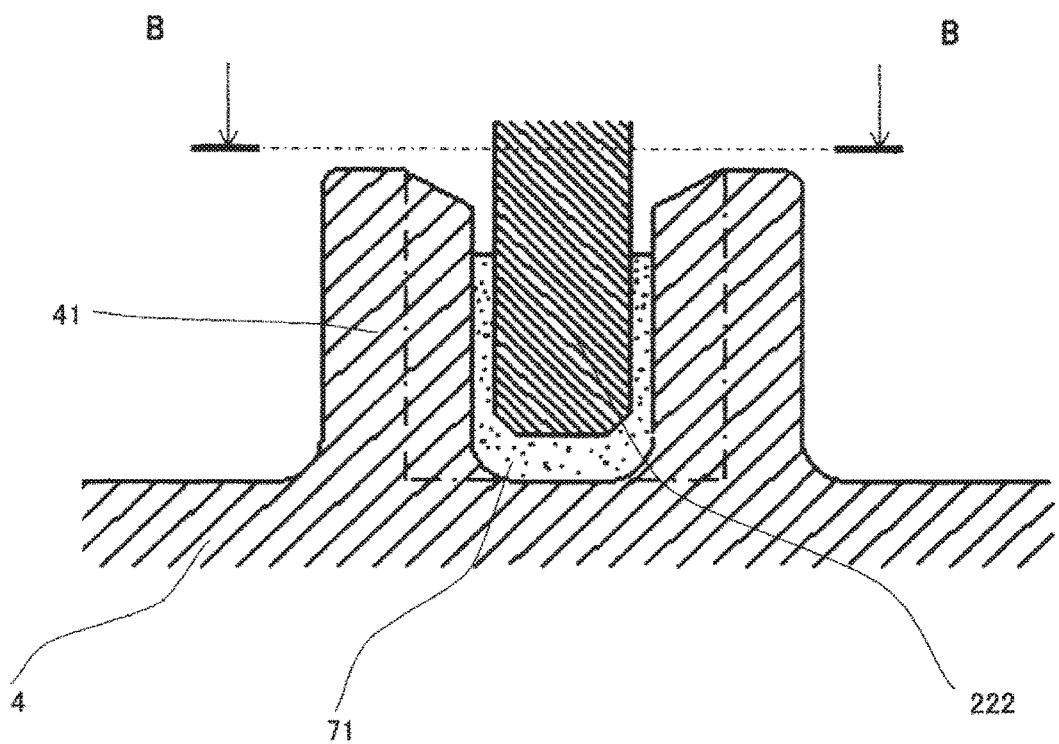
FIG. 9A is a cross-sectional view illustrating a recess in abase incorporated in an electronic control device according to a first modification of the present invention.
Figure 9B:
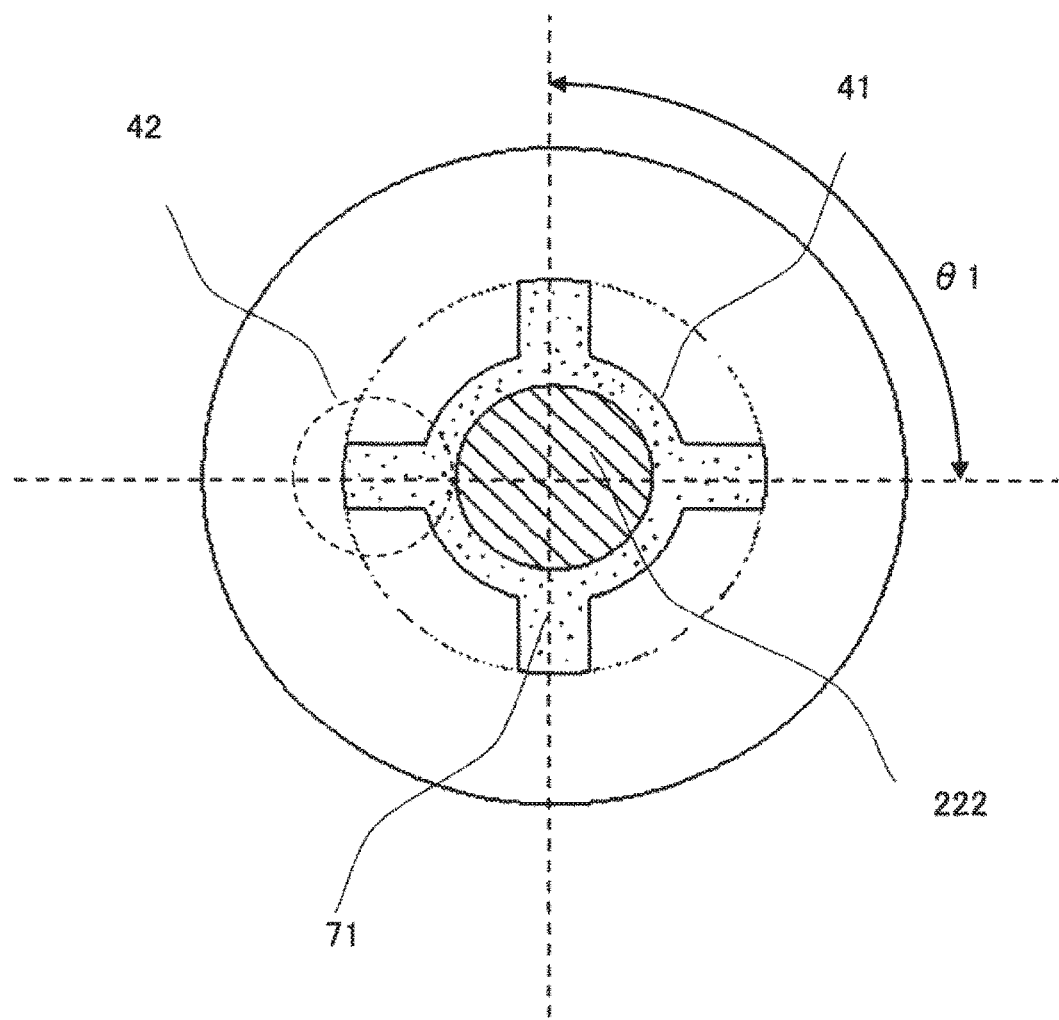
FIG. 9B is a cross-sectional view taken along cut line BB in FIG. 9A.

FIG. 9A is a cross-sectional view illustrating a recess 41 in a base 4 incorporated in an electronic control device 1 according to a first modification of the present invention. FIG. 9B is a cross-sectional view taken along cut line BB in FIG. 9A.

When a vibration-damping member 71 is filled in the recess 41 in the base 4 and a resin pin 222 is then inserted, a greater stress relief effect can be achieved with a narrower clearance between a diameter of the resin pin and an inside diameter of the recess 41. The narrower clearance, however, aggravates a property with which the vibration-damping member 71 can be filled.

As a solution, the recess 41 has a plurality of vibration-damping member discharge grooves 42 formed in an inner peripheral surface thereof as illustrated in FIG. 9B. The vibration-damping member discharge grooves 42 extend perpendicularly to the base 4 and in parallel with an axis of the recess 41 and an axis of the resin pin 222. In the cross-sectional view taken along line BB, illustrated in FIG. 9B, an angle θ1 formed by two adjacent vibration-damping member discharge grooves 42 is 90 degrees.

When the number of vibration-damping member discharge grooves 42 is N (N: a natural number equal to or greater than 2), the angle θ1 is 360/N (degrees).

The angle θ1 of two adjacent adjacent vibration-damping member discharge grooves 42 is equalized to each other. Specifically, the vibration-damping member discharge grooves 42 are disposed at equally spaced intervals along the inner peripheral surface of the recess 41.

The foregoing arrangement allows an excess of the vibration-damping member 71 to be discharged into the vibration-damping member discharge grooves 42 when the resin pin 222 is inserted. This improves readiness with which the resin pin 222 can be inserted.

Additionally, force from the vibration-damping member 71 prevents the resin pin 222 from being deviated. The vibration-damping member 71 that uniformly surrounds the resin pin 222 thus improves vibration damping performance. It is noted that, although FIG. 9B exemplarily illustrates four vibration-damping member discharge grooves 42, the number of vibration-damping member discharge grooves 42 is only required to be two or more.

Second Modification

FIG. 10 is a cross-sectional view illustrating a recess 41 in a base 4 incorporated in an electronic control device 1 according to a second modification of the present invention.

As illustrated in FIG. 10, the recess 41 has a taper 41*t* formed on an inside edge portion thereof. The taper 41*t* accommodates an assembly variation D1 during mounting of the connector.

Specifically, the taper 41*t* is formed on an inner peripheral surface at the leading end of the recess 41. The taper 41*t* guides a resin pin 222 (columnar portion) of a first connector 22. A distance D2 between two facing ends 41*te* of the taper 41 on an outer peripheral side of the recess 41 is greater than the variation D1 in position of the resin pin 222 in a direction extending in parallel with an inside surface of the base 4. An angle θ2 between the inside surface of the base 4 and the taper 41*t* is greater than 45 degrees.

The foregoing structure allows the resin pin 222 to be guided onto the recess 41 even when the first connector 22 is to be inserted in a position that is deviated from the hole position of the recess 41. Thus, enhanced assemblability results.

It should be noted that the present invention is not limited to the above-described embodiments and various modifications may be included. For example, the above-described embodiments have been described in detail to describe the present invention in an easily understandable manner and is not necessarily limited to one having the all configurations described above. Furthermore, part of the configuration in one embodiment can be replaced by a configuration of another embodiment and the configuration in one embodiment can be added to another embodiment. In addition, part of the configuration in each embodiment can be added to or replaced by another, or deleted.

REFERENCE SIGNS LIST 1 electronic control device
2 on-board transmission
21 on-board transmission-side connector
22 first connector
221 first connector pin
222 resin pin (first connector)
223 metal pin
224 first connector housing
225 connector fixing screw
226 sealing groove
23 mounting boss
3 vehicle harness female
31 vehicle system-side connector
32 second connector
321 second connector pin
322 resin pin (second connector)
323 second connector housing
4 base
41 vibration-damping recess
41*p* recess
42 vibration-damping member discharge groove
43 boss
5 cover
6 substrate
7 vibration-damping member
71 vibration-damping member
8 electronic component
9 fastening member
10 heat dissipating material
11 sealing member
111 first sealing member
112 second sealing member
113 third sealing member
114 fourth sealing member

The invention claimed is:

1. An electronic control device comprising:
a substrate on which electronic components are disposed;
a base that covers a first surface of the substrate;
a cover that covers a second surface of the substrate;
a first connector disposed on the second surface of the substrate, the first connector connecting to a connector fixed to an on-board transmission;
a second connector disposed on the second surface of the substrate, the second connector connecting to a connector of a harness; and
a first vibration-suppressing part disposed on an inside surface of the base, the inside surface of the base facing an end face of the first connector on a side adjacent to the second surface, the first vibration-suppressing part suppressing vibration of the first connector, wherein
the first connector includes a columnar portion on the end face of the first connector on the side adjacent to the second surface,
an axis of the first connector and the columnar portion extend in a direction perpendicular to the substrate,
the substrate has a first hole through which the columnar portion is passed, and
the first vibration-suppressing part includes:
a recess that is formed in the inside surface of the base and into which a leading end of the columnar portion is inserted; and
a first vibration-damping member filled in the recess.

2. The electronic control device according to claim 1, wherein the columnar portion is a pin that is integrally molded with the first connector.

3. The electronic control device according to claim 1, wherein the columnar portion is a metal pin that is fixed to the first connector.

4. The electronic control device according to claim 1, wherein
the columnar portion is a screw that fixes the first connector to the substrate, and
the screw has a head portion disposed on the first surface.

5. The electronic control device according to claim 1, wherein the first vibration-suppressing part includes:
a boss provided on the inside surface of the base; and
a first vibration-damping member disposed at a leading end of the boss.

6. The electronic control device according to claim 1, further comprising:
a fastening member that fixes the substrate and the base, wherein
the substrate has a second hole formed between a position at which the first connector is disposed and a position at which the second connector is disposed, the fastening member passing through the second hole.

7. The electronic control device according to claim 1, wherein
the first connector includes:
a groove formed in an outer peripheral surface thereof so as to face the case; and
a second vibration-damping member filled in the groove, and
the case includes:
a third hole through which the first connector is passed; and
a protrusion formed around the third hole, the protrusion facing the recess in the base and fitting into the groove in the first connector.

8. The electronic control device according to claim 1, wherein the recess in the base has at least two grooves in an inner peripheral surface thereof, the at least two grooves extending in parallel with an axis of the recess.

9. The electronic control device according to claim 7, wherein the grooves are disposed at equally spaced intervals along the inner peripheral surface of the recess.

10. The electronic control device according to claim 1, wherein the recess in the base has a taper formed on an inner peripheral surface at a leading end of the recess, the taper guiding the columnar portion of the first connector.

11. The electronic control device according to claim 1, further comprising:
   a second vibration-suppressing part disposed on the inside surface of the base facing an outside surface of the second connector on the side of the second surface of the substrate, the second vibration-suppressing part suppressing vibration of the second connector.

12. The electronic control device according to claim 1, wherein
   the first connector has an axis extending perpendicularly to the substrate, and
   the second connector has an axis extending in parallel with the substrate.

\* \* \* \* \*